US006967123B2

(12) United States Patent
Ng et al.

(10) Patent No.: US 6,967,123 B2
(45) Date of Patent: Nov. 22, 2005

(54) ADHESIVE DIE ATTACHMENT METHOD FOR A SEMICONDUCTOR DIE AND ARRANGEMENT FOR CARRYING OUT THE METHOD

(75) Inventors: Kee Yean Ng, Penang (MY); Keh Chin Seah, Penang (MY); Chong Hai Lee, Penang (MY)

(73) Assignee: Agilent Technologies, Inc., Palo Alto, CA (US)

( * ) Notice: Subject to any disclaimer, the term of this patent is extended or adjusted under 35 U.S.C. 154(b) by 43 days.

(21) Appl. No.: 10/370,435

(22) Filed: Feb. 20, 2003

(65) Prior Publication Data

US 2003/0194831 A1 Oct. 16, 2003

(30) Foreign Application Priority Data

Apr. 11, 2002 (MY) .............................. PI20021343

(51) Int. Cl.[7] ............................................... H01L 21/44

(52) U.S. Cl. ...................................... 438/106; 438/119

(58) Field of Search ......................... 438/106, 118, 119

(56) References Cited

U.S. PATENT DOCUMENTS

| | | | | |
|---|---|---|---|---|
| 6,017,776 | A * | 1/2000 | Jiang et al. | 438/118 |
| 6,046,072 | A * | 4/2000 | Matsuura et al. | 438/118 |
| 6,395,998 | B1 * | 5/2002 | Farquhar et al. | 174/260 |
| 6,458,237 | B1 * | 10/2002 | Tsunoi et al. | 156/310 |
| 6,689,638 | B2 * | 2/2004 | Lin et al. | 438/118 |
| 6,692,610 | B2 * | 2/2004 | Low et al. | 156/273.5 |
| 6,710,462 | B2 * | 3/2004 | Jiang | 257/782 |
| 6,753,922 | B1 * | 6/2004 | Sengupta et al. | 348/374 |

* cited by examiner

*Primary Examiner*—David S. Blum

(57) ABSTRACT

The invention relates to an adhesive attaching method for attaching a semiconductor die to a substrate in which an adhesive is deposited onto the substrate, the deposited adhesive is partially cured and/or dried, the partially cured and/or dried adhesive is reheated and a semiconductor die is placed onto the reheated adhesive, after which the adhesive is fully cured so that the semiconductor die is bonded, both electrically and mechanically, to the substrate.

19 Claims, 8 Drawing Sheets

ADHESIVE DIE ATTACHMENT METHOD FOR A SEMICONDUCTOR DIE AND ARRANGEMENT FOR CARRYING OUT THE METHOD

BACKGROUND OF THE INVENTION

This invention relates to a method and a device for attaching a semiconductor die to a substrate in a manner that an electrical short to the PN junction of the semiconductor die is prevented.

Die attaching forms an integral part of a semiconductor chip packaging process. Die attaching or die bonding is the process of mounting a semiconductor die or chip onto a substrate and this process is well established in the field of semiconductor device manufacturing.

One purpose of the die attaching process is to create a strong physical bond between the die and the substrate of the package. However, it also serves to provide either an electrical conducting or insulating contact between the die and the substrate. There are different known die attaching methods, such as eutectic die attachment, soldering die attachment and adhesive die attachment. The choice among the different die attaching methods in a particular case depends on factors like the size of the semiconductor die, the substrate material and the operating conditions of the final device.

A good die attaching process provides for a die attach which is strong and does not loosen or deteriorate in quality over time. The die attaching process should also be productive and economical. This makes the adhesive die attaching process popular as this process is very robust and can provide for a high throughput using automated equipments.

In the process of adhesive die attachment using conductive adhesive according to the prior art, a small amount of conducting adhesive is dotted or dispensed onto a substrate 102 as shown in FIG. 1. A collet then picks up a semiconductor die 100 from a wafer ring and brings the semiconductor die 100 directly above the adhesive on the substrate 102. The collet then places the die 100 onto the adhesive in a downward manner, exerting a slight pressure to press the semiconductor die 100 down firmly onto the adhesive. As a result of this action, the excess adhesive 101 wets up the sides of the semiconductor die 100, forming a fillet 101 around the lower region of the die 100. The adhesive is subsequently cured by heating in order to harden the same and thereby to provide a firm bond between the die 100 and the substrate 102 so that the semiconductor die 100 is reliably held in place and electrically connected with its bottom surface electrode to the respective contact surface of the substrate 102.

Many semiconductor dice, in particular LEDs (Light Emitting Diodes), laser diodes and photodetectors have an N-doped 103 and a P-doped 104 portion as shown in FIG. 2 (or vice versa). The PN junction 105 of the N-doped 103 and P-doped 104 portions of the semiconductor die may be grown very near, e.g. less than 50 $\mu$m, to the base of the die. In fact, there is a tendency to grown the PN junction as close to the base of the die as possible, since a low PN junction provides the device with desirable characteristics like high light output and good heat conductivity. However, when the excess adhesive wets up the sides of the die and thereby forms a fillet 101 around the lower region of the die 100 which contains the PN junction 105, an electrical short circuit occurs at the PN junction 105 as it is short-circuited by the conductive adhesive, and the die 100 will become useless.

One known solution to overcome this problem is to reduce the amount of adhesive used for the attaching process. For example, in case of a LED die with a size of 0.25 mm square, the diameter of the conductive adhesive dot dotted onto the substrate must be kept less than 0.2 mm to prevent wetting up of the sides of the die and thereby shorting of the PN junction. However, reducing the diameter and thereby the amount of adhesive dot leads to deterioration of the overall mechanical strength of the bond of the die to the substrate and thus to reliability problems, especially if the device is operated in a cyclical temperature environment. In particular, with a reduced amount of adhesive, the lateral strength of the bond is significantly reduced. Furthermore, the deposition of a small and accurate amount of adhesive makes the die attachment process very difficult to control.

Another known solution to overcome the above described problem is to use eutectic die attach instead of adhesive die attach. The eutectic die attaching method is adopted by many companies due to the strong bonding and good heat dissipation properties of the eutectic die attach.

However, the automation of the process for eutectic bonding is not as easy as the automation of the adhesive die attaching method. Further, the adhesive die attaching method is cheaper and requires a lower bonding temperature than the eutectic die attaching method.

Still another known solution for the above described problem uses a method in which the conductive adhesive is dispensed and partially cured on the wafer before sawing the same into individual dice. Typically, a silver epoxy adhesive is deposited onto the wafer and the epoxy is pre-cured before the wafer is cut into individual dice for attachment to the substrates. Furthermore, in this method, the conductive adhesive is formed by an epoxy material to which silver balls as electrically conductive fillers are added. The use of ball-formed fillers containing adhesive is necessary in this method, since only such ball-formed particles enable a uniform, even dispersion of the adhesive over the entire surface of the wafer.

However, one disadvantage of this method is that it may not be suitable in cases where the individual dice still have to undergo further chemical and/or heat treatments before they are attached or bonded to the substrate, since such an additional treatment could alter essential bonding characteristics of the adhesive and thereby render the adhesive not useable for the later bonding purposes, or eventually even wash away the adhesive from the surface of the die. Therefore, this method cannot be used for example in cases where a post-saw etching process is needed or in cases of non-rectangular dice, like a shaped-die with trapezoid cross-section, since the production of such dice may require a chemical treatment of the individual dice after sawing the wafer into the said individual dice.

SUMMARY OF THE INVENTION

It is an object of the invention to provide an adhesive die attachment method for attaching a semiconductor die to a substrate, which method does not cause an electrical short to the PN junction of the semiconductor die even if the PN junction is formed very close to the base of the die, which is not particularly sensitive to the amount of adhesive used and, therefore, easy to control, which can be used for any type of dice with different shapes, including such with trapezoid vertical cross-section, and which provides both for a good mechanical bond of the die to the substrate and for a reliable electrical connection between the die and the substrate.

It is a further object of the invention to provide a suitable, reliable and simple die attaching arrangement to carry out the method according to the invention.

These objects of the invention are solved with the features of the method and the arrangement, respectively, as claimed in the respective independent claims. Preferred embodiments of the inventive method and device are defined in the respective dependent claims.

According to the invention, a small amount of conductive adhesive is deposited onto a substrate. The adhesive deposited is then partially treated by exposing the adhesive to heat, preferably by partial curing and/or drying, so that it becomes partially hardened. In case of partial curing, which happens if the adhesive is subjected to heat, the adhesive is partially polymerized, whereas in case of drying the adhesive the solvent present therein is driven out from the adhesive. According to the invention, the preferable way of pre-treatment of the adhesive is the drying, since this process ensures the necessary hardness of the adhesive and, at the same time, enables the utilization of at least substantially the full polymerization process for the final curing of the adhesive, thereby providing for the strongest possible electrical and mechanical bonding of the die to the substrate. The drying as pre-treatment is carried out by subjecting the adhesive to an elevated (but still low) temperature for a short period of time. However, since every heat treatment of the adhesive brings about also a polymerization of the same, a partial curing can never be avoided, even if primarily a drying is intended.

The hardened adhesive is subsequently reheated so that it softens to some extent, and a semiconductor die picked up preferably from a wafer ring by a collet at the same time is positioned directly above the softened adhesive. When in the position above the softened adhesive, the collet firmly places the semiconductor die directly onto the softened adhesive in a downward direction and presses the same into the adhesive under applying a pressure onto the die.

As a result of the pressure exerted to the adhesive by the semiconductor die, excess adhesive, if any, is squeezed out from between the die and the substrate. However, as experimented by the inventors of this invention, due to the pre-treatment of the adhesive, the adhesive is squeezed out from between the die and the substrate in such a way that it does not wet up the sides of the die and, accordingly, does not contact the lower region of the semiconductor die to form a fillet around it. Rather, the excess amount of adhesive squeezed out from between the die and the substrate surrounds the lower region of the semiconductor die with a gap between the sides of the die and the squeezed out adhesive. Consequently, the excess adhesive does not cause an electrical short circuit to the PN junction of the semiconductor die. This characteristics of the adhesive attach produced by the adhesive die attaching method according to the invention is particularly advantageous in case of dice with low PN junction, in particular LEDs, laser diodes and photo-detectors.

The amount of adhesive that is squeezed out depends on how much adhesive was deposited on the substrate. The above described characteristics of the die attaching method according to the invention, namely that the squeezed-out adhesive does not cause an electrical short to the PN junction of the semiconductor die, is valid for up to at least about 3 to 4 times of the maximum adhesive amount which could be used with the prior art method without causing an electrical short. For example, turning to the example given above with regard to the prior art method, in case of a LED die with a size of 0.25 mm square with a low PN junction located for instance, less than 50 $\mu$m from the bottom of the die, the diameter of the conductive adhesive dot dotted onto the substrate according to the invention can be increased up to about 0.6–0.8 mm without the problem of causing an electrical short to the PN junction of the LED die. Therefore, since the method according to the invention enables the use of a larger amount of adhesive the mechanical strength, and, in particular, the lateral strength of the bond of the die to the substrate are sufficiently high. Furthermore, the method according to the invention does not need a very exact amount of adhesive to be deposited onto the substrate, as the excess adhesive squeezed out from between the die and the substrate does not cause an electrical short to the PN junction of the dies. This means in above example that the amount of the adhesive can be chosen according to the invention so that the diameter of the deposited adhesive dot may reach up to 0.6 mm instead of 0.2 mm as according to the example described in connection with the state of art method.

After the semiconductor die is placed under pressure onto the adhesive, the adhesive is fully cured so that it becomes hardened and holds the semiconductor die firmly on the substrate. This completes the die attaching method according to the invention.

In other words, the objective of the invention with regard to the die attaching method is achieved by adding the addition steps of partially curing and/or drying and subsequently reheating the adhesive before a semiconductor die is placed onto the adhesive, in which method the adhesive is subsequently fully cured to hold the semiconductor die on the substrate.

According to a preferred embodiment of the invention, a conductive filler containing adhesive, in a paste or gel form, which is capable of being partially cured and/or dried into a hardened state is used. This partially cured and/or dried and, thereby hardened state is also known as B-stage. In this partially cured and/or dried stage, the adhesive has a glass transition temperature, which is higher than room temperature, and hence exists in the said hardened state at room temperature. Upon re-heating the partially cured and/or dried adhesive to a temperature higher than the glass transition temperature, the adhesive softens and continues its curing process. During this curing process, the adhesive undergoes polymerization. Accordingly, the adhesive is fully cured only at a temperature specific to the chemistry of the adhesive.

According to a preferred embodiment of the invention, the conductive filler used for the adhesive is a metallic or metallic-coated filler. The advantage of such metallic fillers compared to other conductive fillers, like carbon fillers, is that it provides for an excellent conductivity of the adhesive which is necessary in order to achieve a reliable electrical connection between the electrodes provided on the die and the substrate, respectively.

According to the preferred embodiment of the invention, the semiconductor die to be attached to the substrate is a LED.

According to other embodiments of the invention, the semiconductor die to be attached to the substrate may be a laser diode or a photo-detector.

According to a further aspect of the invention, an arrangement for carrying out the adhesive die attaching method for attaching a semiconductor die to a substrate is provided, the arrangement comprising a depositing unit for depositing an adhesive onto the substrate, a partial curing and/or drying unit for partially curing and/or drying the adhesive, a reheating unit for reheating the adhesive, a placing unit for placing a semiconductor die onto the adhesive, preferably using a collet, and a final curing unit for fully curing the adhesive, thereby attaching the semiconductor die to the substrate.

DETAILED DESCRIPTION OF THE INVENTION

Preferred embodiments of the adhesive attaching method for attaching a semiconductor die to a substrate according to the invention is shown in, and described in the following with reference to FIG. 3*a* to FIG. 3*h*.

Figure 1:
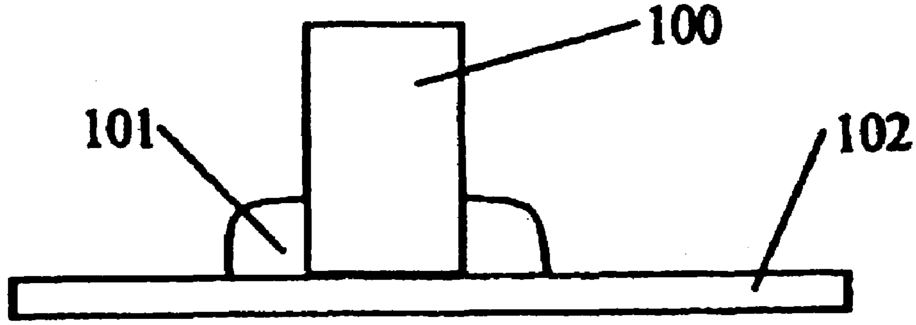
FIG. 1 shows the excess adhesive forming a fillet around a die, wherein a die attaching method according to the prior of the art is used.
Figure 2:
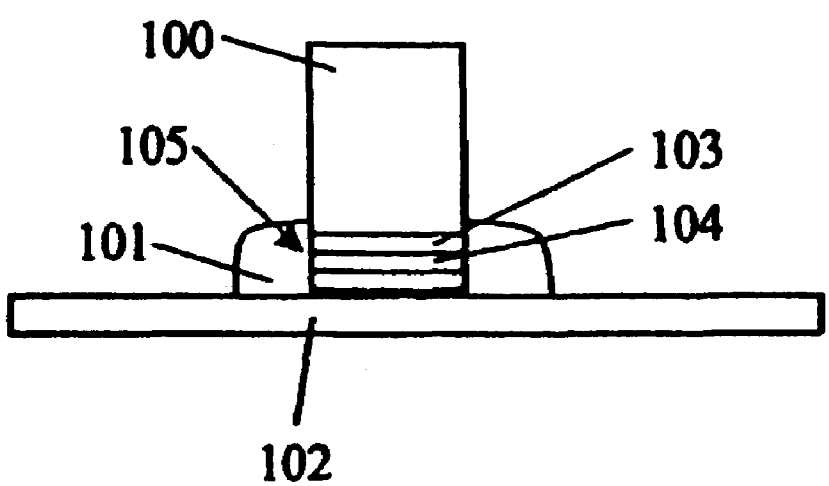
FIG. 2 shows the excess adhesive causing an electrical short circuit to a die with a low PN junction, wherein a die attaching method according to the prior of the art is used.
Figure 3A:
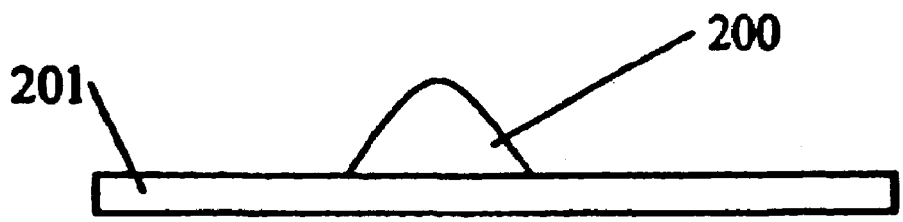
FIG. 3*a* shows the deposition of conductive adhesive on a substrate according to a preferred embodiment of the invention.

A drop of adhesive 200 is deposited onto a substrate 201 such as a leadframe, a ceramic, glass or flexible circuit board, or a plastic or printed circuit board (PCB), using a dotting, stamping or dispensing process as shown in FIG. 3*a*. The adhesive may also be deposited on the substrate 201 using a silk-screening, stencilling or ink-jet process.

According to the preferred embodiment of the invention, the adhesive 200 is formulated from epoxy thermoset resins, thermoplastic resins or silicone. The epoxy is either a one-component or a two-component epoxy formulation consisting of resin as the first component and a catalyst hardener as the second component. The epoxy is also mixed with a metallic filler material to enable the adhesive to be electrically conductive. In this preferred embodiment of the invention, the metallic filler material used is silver.

According to this embodiment of the invention, the silver filler mixed with the epoxy may be in the shape of balls or powders. However, it has been observed that, since in the method according to the invention it is not necessary to evenly dispense the adhesive on a large surface (as e.g. in the above explained prior art method in which the adhesive is dispensed on the entire surface of the wafer), the use of flake-shaped fillers is possible. Therefore, according to a further preferred variation of this embodiment of the invention, flake-like fillers are used, since such fillers provide for better electrical and thermal conductivity than ball- or powder-shape fillers.

Figure 3B:
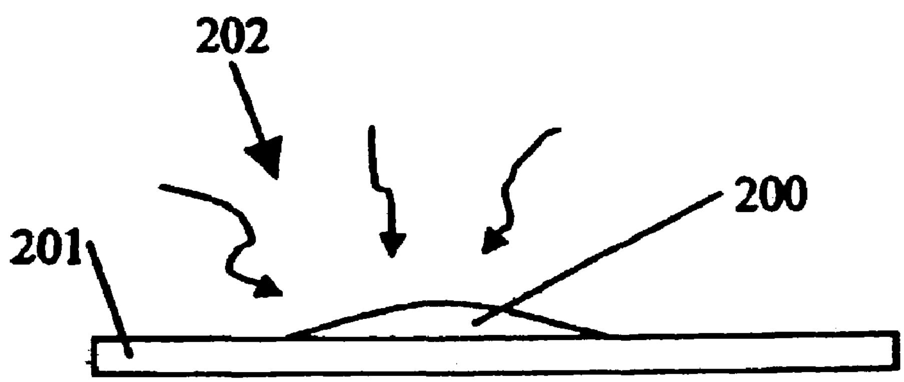
FIG. 3*b* shows the partial curing and/or drying of the adhesive according to a preferred embodiment of the invention.

In the next step of the method according to the invention, the adhesive 200 on the substrate 201 is partially cured and/or dried, preferably by heating. According to the preferred embodiment of the invention, the heat is generated through conduction with the use of a heater stage. According to another embodiment of the invention, the heat may be generated by a stream of hot air (heat convection), by radiation of IR or intense beam of light, by microwave or UV irradiation 202 as shown in FIG. 3*b*, or a combination of any of the methods thereof.

Figure 3C:
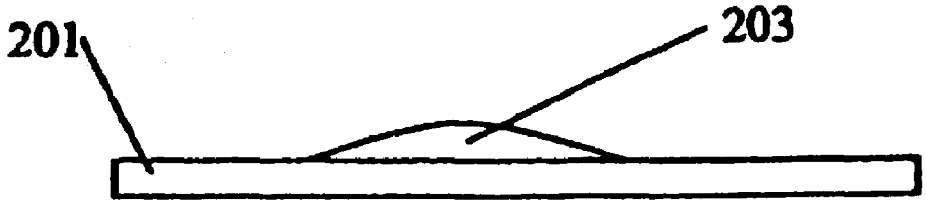
FIG. 3*c* shows the adhesive, which is partially cured and/or dried and hardened upon cooling according to a preferred embodiment of the invention.
Figure 3D:
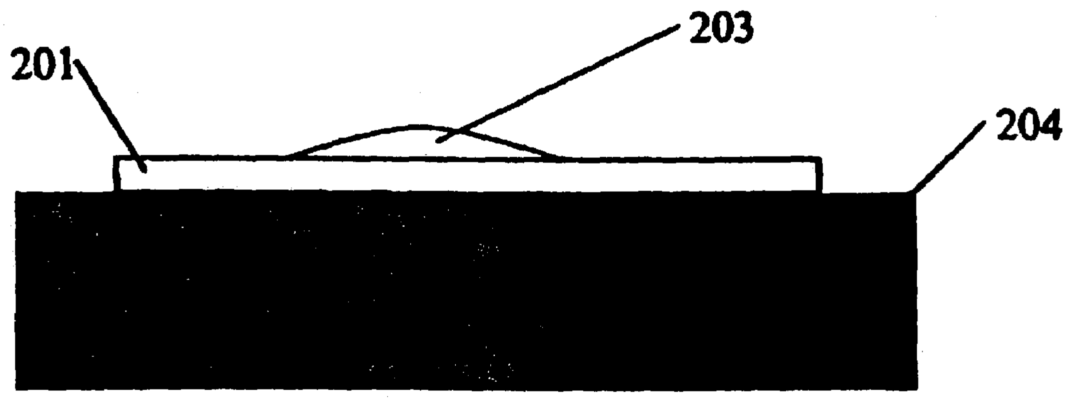
FIG. 3*d* shows the reheating of the adhesive using a heater stage according to a preferred embodiment of the invention.
Figure 3E:
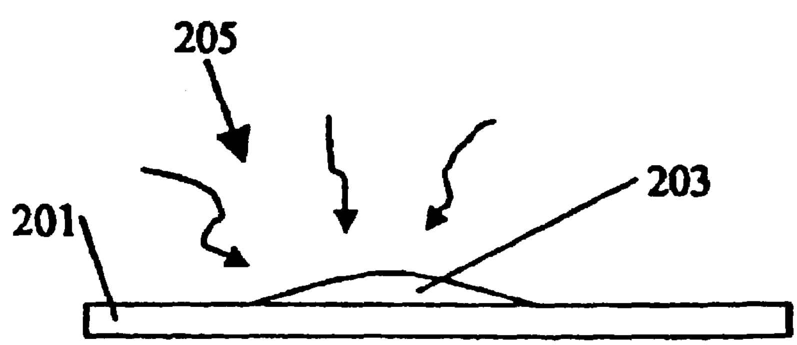
FIG. 3*e* shows the reheating of the adhesive using IR radiation or UV irradiation according to another preferred embodiment of the invention.

A temperature between 25° C. and 200° C. and a treatment duration between 1 to 120 minutes are used for the purpose of partially curing and/or drying the adhesive 200. After the adhesive 203 is partially cured and/or dried, it is in a hardened state at room temperature as shown in FIG. 3*c*. The hardened partially cured and/or dried adhesive 203 is subsequently reheated on a heater stage 204 according to the preferred embodiment of the invention as shown in FIG. 3*d*, so that the adhesive 203 is softened again to some extent. According to another embodiment of the invention, the reheating of the partially cured and/or dried adhesive 203 may alternatively be carried out by heat convection, by radiation of IR or intense light, by microwave or UV irradiation 205 as shown in FIG. 3*e*, or a combination of any of the methods thereof.

The heater stage 204 is set to a temperature between 25° C. and 300° C. and the reheating is carried out for a duration between 1 second to 30 minutes.

Figure 3F:
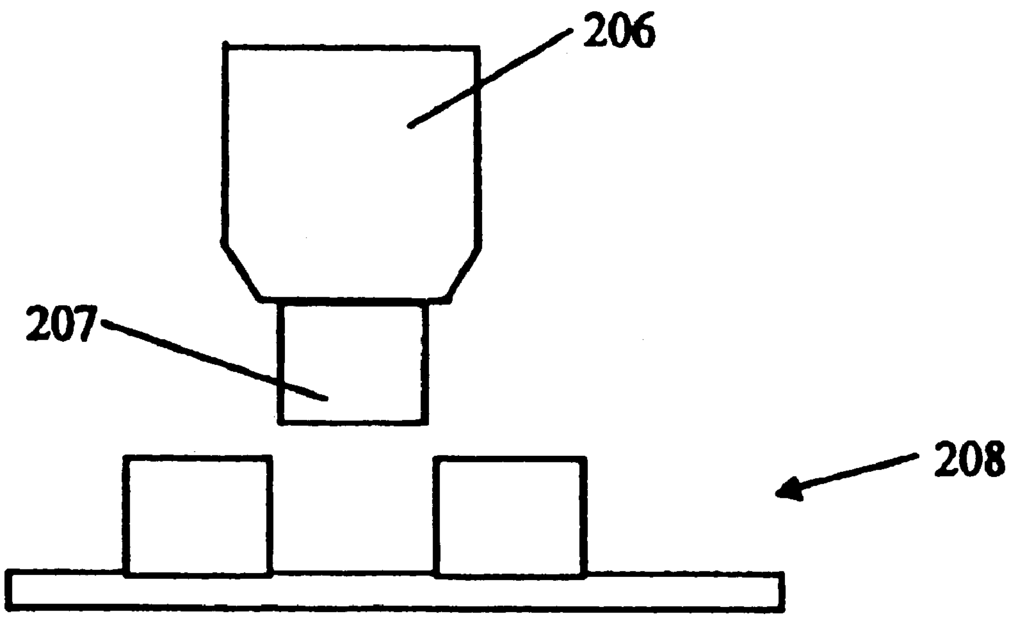
FIG. 3*f* shows a semiconductor die being picked up from a wafer ring using a collet according to a preferred embodiment of the invention.
Figure 3G:
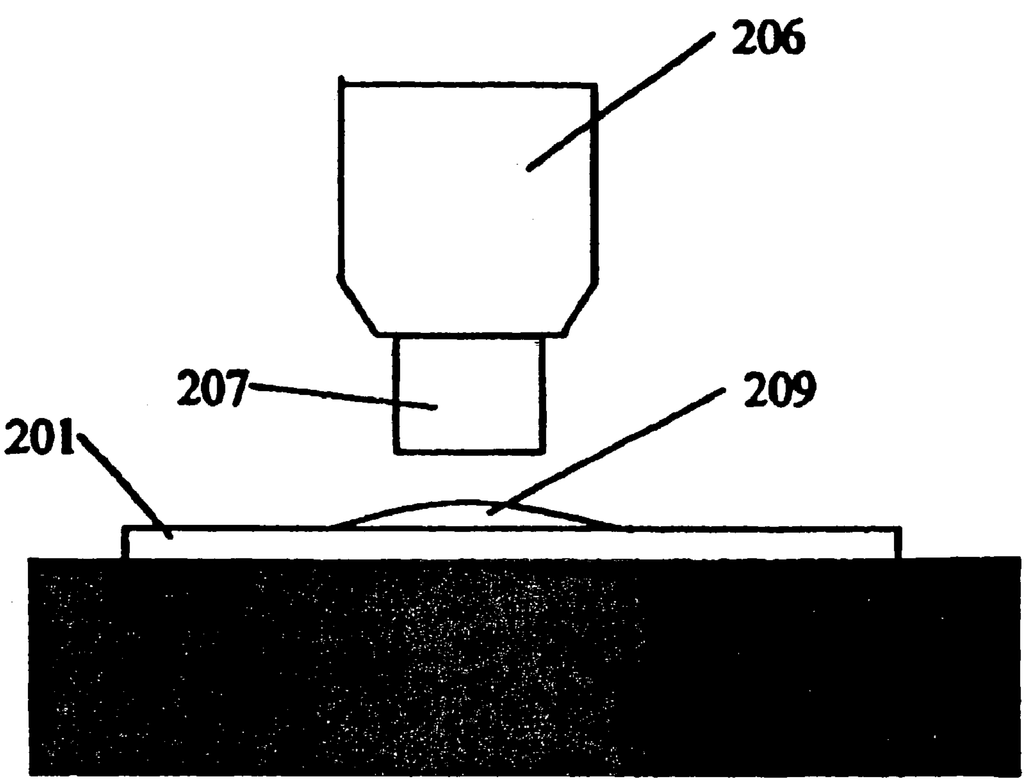
FIG. 3*g* shows the positioning of the semiconductor die above the softened adhesive according to a preferred embodiment of the invention.
Figure 3H:
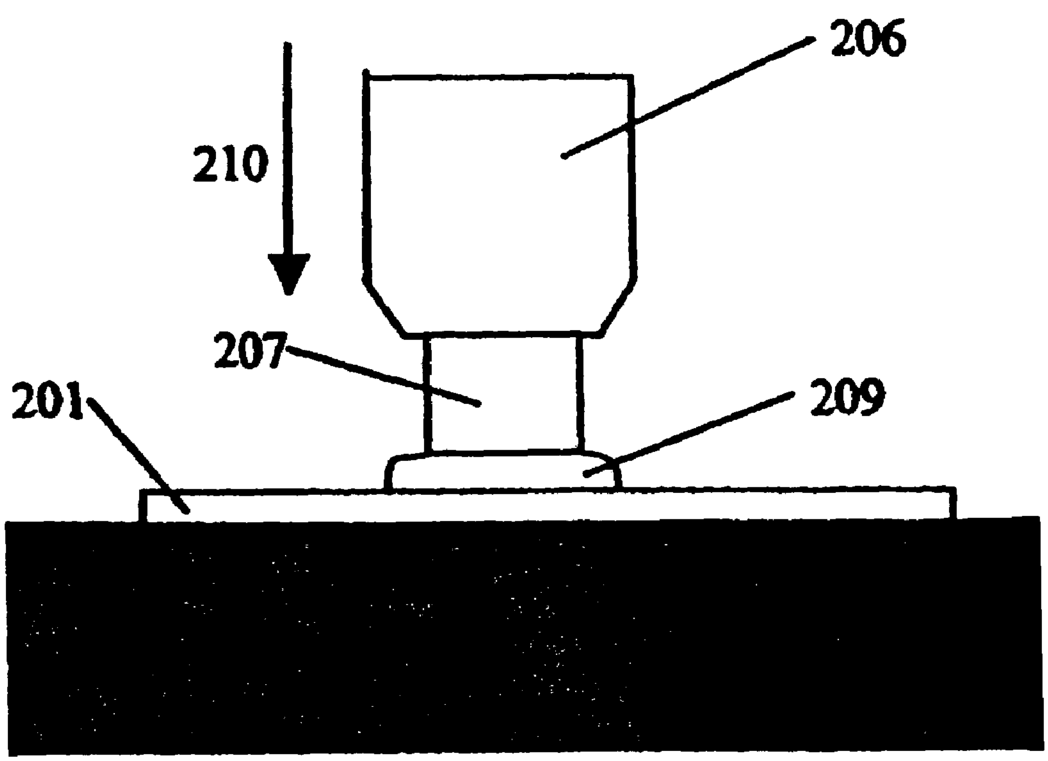
FIG. 3*h* shows the placing of the semiconductor die onto the softened adhesive with pressure by the collet according to a preferred embodiment of the invention.

According to the preferred embodiment of the invention, a semiconductor die 207 is picked up by a collet 206 from a wafer ring 208 and brought to the position directly above the softened adhesive 209, as shown from FIG. 3*f* to FIG. 3*g*. The semiconductor die 207 is then pressed firmly onto the adhesive 209 in a downward manner by the collet 206, as shown in FIG. 3*h*.

The pressure 210 exerted by the collet 206 via the semiconductor die 207 onto the adhesive 209 is preferably in the range of 5 MPa to 30 MPa.

Figure 4:
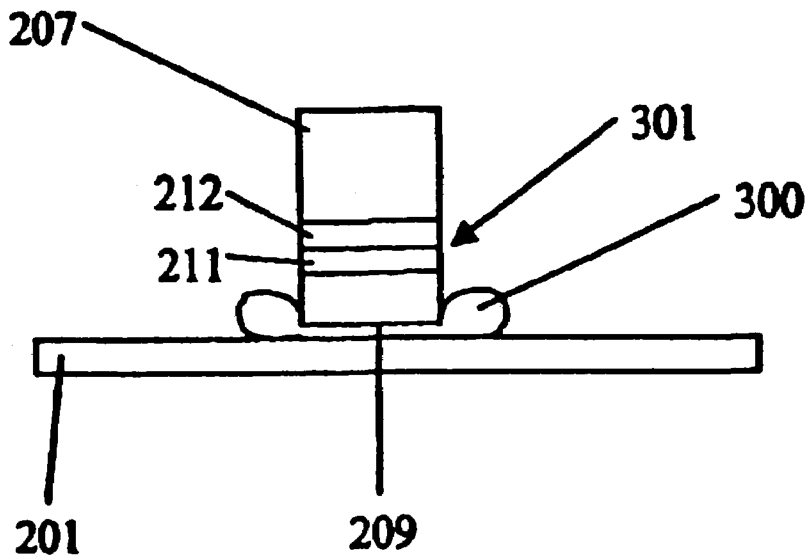
FIG. 4 shows the configuration of the excess adhesive squeezed out from between the die and the substrate according to a preferred embodiment of the invention.

As shown in FIG. 4, when the pressure 210 is exerted by the collet 206 through the die 207 onto the adhesive 209, excessive adhesive, if any, is squeezed out from between the die 207 and the substrate 201 and forms a collar 300 around the die. However, due to the pre-treatment, i.e. the partial curing and/or drying of the adhesive, the said collar 300 resulting from the squeezing out of the excessive adhesive does not wet up and contact the side surfaces of the die 207 and, accordingly, does not cause a short between the PN junction 301 of the same.

Subsequently, the adhesive 209 is fully cured by heating so that it is hardened and bonds and holds the semiconductor die 207 to the substrate 201. During this step of final curing of the adhesive 209, the gap between the collar 300 (i.e. the squeezed out excessive adhesive) and the die 207 is maintained. The final curing of the adhesive 209 is carried out by curing the same with heating to a temperature between 50° C. to 300° C. for a duration of 30 minutes to 300 minutes.

As described above, according to the invention, the squeezed out excessive adhesive 300 does not form a fillet around and in contact with the semiconductor die 207. Rather, it forms a collar 300 around the die 207 which is not in contact with the side surfaces of the die 207. Consequently, the squeezed out excessive adhesive 300 does not cause an electrical short circuit at the PN junction 301 of the P-doped 211 and the N-doped 212 portion of the semiconductor die 207.

Figure 5:
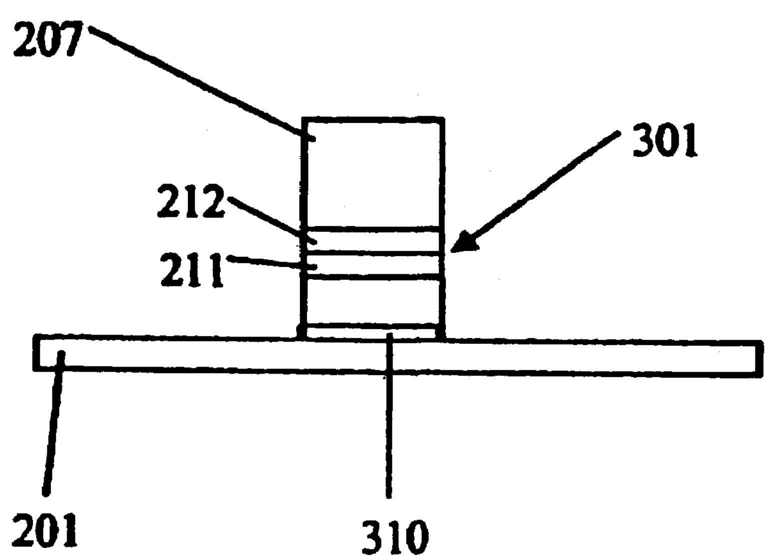
FIG. 5 shows the bonded die when no excess adhesive is squeezed from between the die and the substrate according to a preferred embodiment of the invention.

The amount of adhesive that is squeezed out 300 from between the die 207 and the substrate 201 depends on the amount of the adhesive 200 deposited onto the substrate 201. If the amount of the adhesive 200 deposited on the substrate 201 is not in excess, no adhesive is squeezed out from between the die 207 and the substrate 201. In this case, a flat film of adhesive 310 is obtained just below the semiconductor die 207 between the substrate 201 and the die 207, as shown in FIG. 5. However, even if the amount of the adhesive 200 deposited on the substrate 201 is in excess resulting in a squeezing out of the same from between the die 207 and the substrate 201, the squeezed out portion of the adhesive does not cause a short to the PN junction 301 of the die 207. Therefore, according to the invention it is possible to use a larger amount of adhesive which ensures a good electrical contact and mechanical bonding strength between the die 207 and the substrate 201 without the danger of shorting the PN junction 301 of the die 207.

The inventive method is particularly suitable for attaching a semiconductor die with low PN junction, for instance less than 50 $\mu$m from the base, such as a LED to a substrate. For LEDs, a low PN junction is required for obtaining certain desired optical and/or thermal characteristics and hence an alternative LED with a higher PN junction is not preferable. Further, the adhesive die attaching method is cheap, especially in an automated process, and requires low treatment (curing and/or drying) temperatures, which is advantageous for dies to be attached to substrates.

Figure 6:
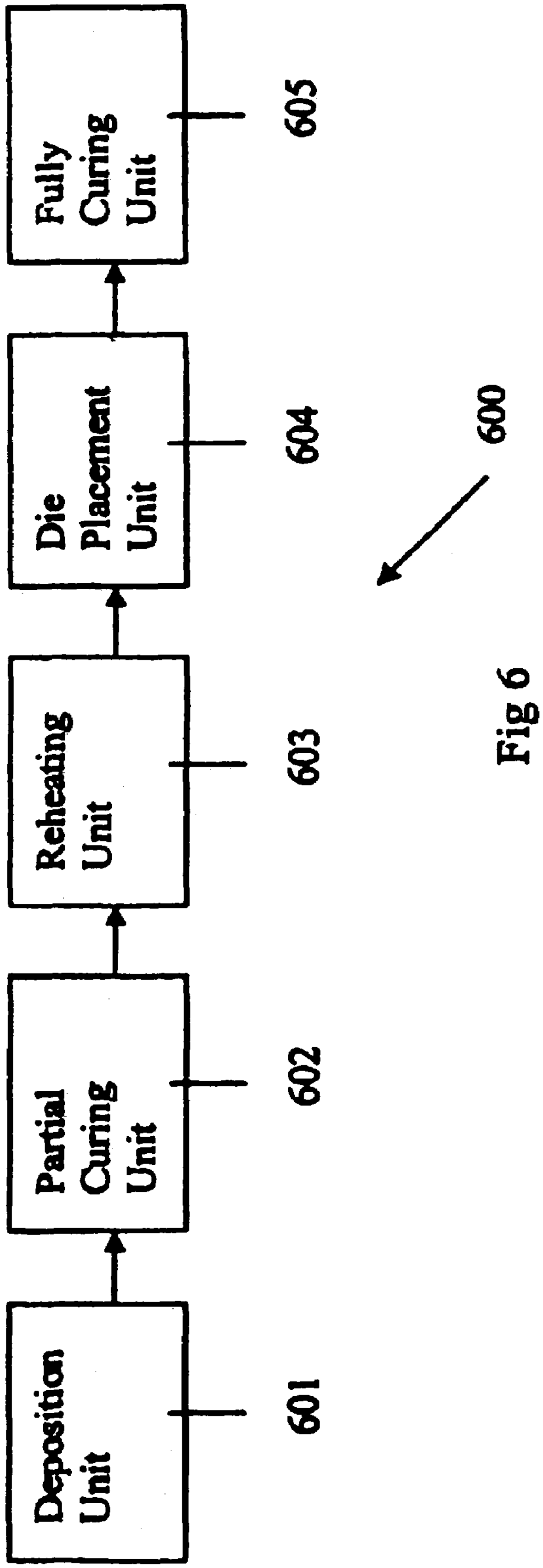
FIG. 6 shows a schematic block diagram of a tie-line arrangement for carrying out the method according to the invention.

FIG. 6 shows a schematic block diagram of an arrangement 600 according to the invention for carrying out the inventive die attaching method.

The arrangement 600 shown is a so-called tie-line or in-line arrangement which comprises a number of treatment stations arranged side-by-side relative to each other. In this embodiment, the arrangement according to the invention comprises a deposition unit 601 for depositing a conductive adhesive onto the substrate, a partial curing and/or drying unit 602 for partially curing and/or drying the adhesive, respectively, a reheating unit 603 for reheating the adhesive, a die placement unit 604 for placing a semiconductor die onto the adhesive and pressing the same thereon, preferably using a collet, and a final curing unit 605 for fully curing the adhesive, thereby bonding the semiconductor die, both electrically and mechanically, to the substrate. In this embodiment of the arrangement the partial curing and/or drying unit 602 and the final curing unit 605 are implemented by using two separate ovens for the partial and the final curing of the adhesive, respectively.

Alternatively, the partial curing and/or drying unit 602 can be embodied by a laser curing mechanism arranged in-line and downstream with the adhesive deposition unit 601.

Figure 7:
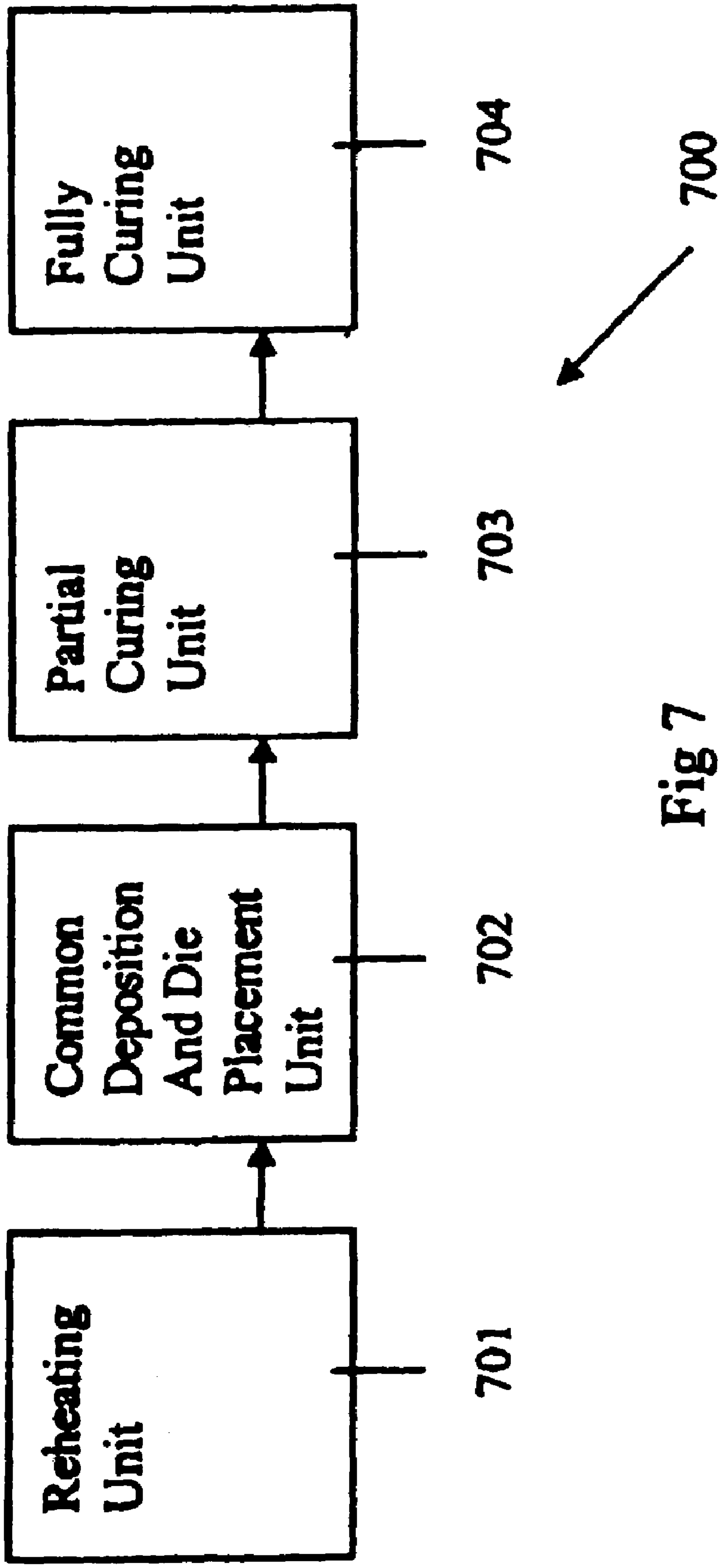
FIG. 7 shows a schematic block diagram of another embodiment of a tie-line arrangement for carrying out the method according to the invention.

FIG. 7 shows a schematic block diagram of another preferred embodiment of an arrangement 700 according to the invention for carrying out the inventive die attaching method.

In this further preferred in-line embodiment of the arrangement 700 according to the invention the adhesive deposition unit and the die placement unit are implemented in a single common station of the arrangement 700; called, in FIG. 7, the common deposition and die placement unit 702. A reheating unit 701 is arranged upstream of the common deposition and die placement unit 702. A partial curing unit 703 and a final curing unit 704 are arranged in-line and downstream with the common deposition and die placement unit 702. Accordingly, in this preferred embodiment of the arrangement 700, the deposition of the adhesive on the substrate and the placement of the semiconductor die onto the substrate are carried out in the same common station, wherein the die placement operation (i.e. the collet operation) is disabled during the adhesive deposition, and vise versa. The substrate has to be led through the arrangement 700 twice, for a first time for the adhesive deposition in the common deposition and die placement unit 702 which is followed by the partial curing and/or drying operation in the corresponding partial curing unit 703 arranged in-line with the common station, and for a second time for the reheating in the reheating unit 701 and the die placement operation carried out in the said common station, before entering the final curing unit 704 of the arrangement. In this embodiment of the arrangement 700, the reheating unit 701 and the die placement operation in the common deposition and die placement unit 702 are disabled during the first pass of the substrate through the arrangement 700 and the substrate is taken out of the arrangement 700 after the partial curing in the partial curing unit 703 is completed, whereas during the second pass of the substrate through the arrangement 700 the adhesive deposition operation in the common deposition and die placement unit 702 and the partial curing unit 703 are disabled and the substrate proceeds until completion of the full curing in the final curing unit 704.

According to another embodiment of the arrangement (not shown), the partial curing and/or drying unit constitutes a separate unit which is not arranged in-line with the adhesive deposition unit. In this embodiment of the inventive arrangement the substrate is transferred to the separate partial curing and/or drying unit for batch curing after deposition of the adhesive in the adhesive deposition unit. Although in this case the same oven could be used for the partial curing and/or drying and the final curing of the adhesive, it is preferred to use two separate ovens for these operations, since the necessary parameters (especially the temperature and the duration, as described above) of the respective curing operations and, accordingly, the respective settings of the ovens are significantly different.

What is claimed is:

1. An adhesive die attaching method for attaching a semiconductor die to a substrate, the method comprising:

depositing a conductive adhesive onto the substrate;

after depositing the conductive adhesive, partially treating the adhesive by exposing the adhesive to heat;

after partially treating the adhesive, allowing the adhesive to harden;

reheating the hardened adhesive to soften the adhesive;

placing the semiconductor die on the softened adhesive; and after placing the semiconductor die, fully curing the adhesive, thereby attaching the semiconductor die to the substrate.

2. The method as claimed in claim 1 wherein the step of partially treating the adhesive is carried out by partially curing and/or drying the adhesive.

3. The method as claimed in claim 2 wherein partially treating the adhesive is carried out by subjecting the adhesive to an elevated temperature for a short period of time.

4. The method as claimed in claim 3 wherein partially treating the adhesive is carried out by subjecting the adhesive to a temperature between 25 and 200° C. for 1 to 120 minutes.

5. The method as claimed in claim 1 wherein partially treating the adhesive is performed by heat conduction, heat convection or heat radiation, or a combination thereof.

6. The method as claimed in claim 5 wherein partially treating the adhesive is performed in an oven by placing the substrate carrying the adhesive into the same.

7. The method as claimed in claim 5 wherein partially treating the adhesive is performed by irradiating the adhesive with a laser beam.

8. The method as claimed in claim 1 wherein reheating the adhesive is performed at a temperature of 25 to 300° C. for a duration of 1 second to 30 minutes.

9. The method as claimed in claim 1 wherein placing the semiconductor die onto the adhesive includes the step of pressing the semiconductor die into the adhesive.

10. The method as claimed in claim 9 wherein the pressure applied to the semiconductor die is in the range of 5 to 30 MPa.

11. The method as claimed in claim 1 wherein final curing the adhesive is performed at a temperature of 50 to 300° C. for a duration of 30 to 300 minutes.

12. The method according to claim 1 wherein at least one of a LED, a laser diode and a photo-detector is used as the semiconductor die.

13. The method according to claim 1 wherein a leadframe, a printed circuit board (PCB), a flexible circuit board, or a ceramic, glass or plastic board is used as the substrate.

14. The method according to claim 1 wherein a paste or gel form of the adhesive is used.

15. The method according to claim 1 wherein the conductive adhesive is produced by adding a metallic filler material to a basic material of the adhesive.

16. The method according to claim 15 wherein silver is used as the metallic filler material.

17. The method according to claim 15 wherein silver in the form of flakes is used as the metallic filler material.

18. The method according to claim 15 wherein an epoxy thermoset resin, a thermoplastic resin or silicone is used as the basic material of the adhesive.

19. The method according to claim 18 wherein a one-component epoxy formulation or a two-component epoxy formulation is used as the basic material of the adhesive.

* * * * *